(12) United States Patent
Yamazaki et al.

(10) Patent No.: US 7,211,502 B2
(45) Date of Patent: May 1, 2007

(54) METHOD FOR MANUFACTURING SEMICONDUCTOR DEVICE

(75) Inventors: Shunpei Yamazaki, Tokyo (JP); Tetsuji Yamaguchi, Kanagawa (JP); Atsuo Isobe, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 51 days.

(21) Appl. No.: 10/806,353

(22) Filed: Mar. 23, 2004

(65) Prior Publication Data

US 2004/0241980 A1 Dec. 2, 2004

(30) Foreign Application Priority Data

Mar. 26, 2003 (JP) ............................. 2003-085733

(51) Int. Cl.
*H01L 21/44* (2006.01)
(52) U.S. Cl. .................................................... 438/597
(58) Field of Classification Search ................ 438/597, 438/149, 30, 688, 680, 660, 659, 658, 652, 438/646; 257/758, 365, 347, 86, 79, 72, 257/66, 59; 478/597
See application file for complete search history.

(56) References Cited

U.S. PATENT DOCUMENTS

| | | | |
|---|---|---|---|
| 4,502,210 A | 3/1985 | Okumura et al. |
| 5,169,803 A | 12/1992 | Miyakawa |
| 5,283,206 A | 2/1994 | Sugano |
| 5,512,512 A | 4/1996 | Isobe |
| 5,534,463 A | 7/1996 | Lee et al. |
| 5,589,713 A | 12/1996 | Lee et al. |
| 5,641,993 A | 6/1997 | Yamaha et al. |
| 5,665,659 A | 9/1997 | Lee et al. |
| 5,719,446 A | 2/1998 | Taguchi et al. |
| 5,723,367 A | 3/1998 | Wada et al. |
| 5,747,360 A | 5/1998 | Nulman |
| 5,789,317 A | 8/1998 | Batra et al. |
| 5,830,786 A | 11/1998 | Zhang et al. |

(Continued)

FOREIGN PATENT DOCUMENTS

JP 10-125783 5/1998

*Primary Examiner*—Carl Whitehead, Jr.
*Assistant Examiner*—Monica D Harrison
(74) *Attorney, Agent, or Firm*—Nixon Peabody LLP; Jeffrey L. Costellia

(57) ABSTRACT

A method for manufacturing a semiconductor device in which lower cost can be realized, a wiring with favorable coverage can be formed in a contact hole having a large aspect ratio, wiring capacitance can be reduced and a multilayer wiring can be formed, can be provided. In order to obtain the semiconductor device, the following steps are required; forming a first conductive film which serves as a barrier so as to be in contact with an organic insulating film with an opening portion formed; forming a second conductive film including aluminum so as to be in contact with the first conductive film; or forming a nitride film so as to be in contact with the organic insulating film with the opening portion formed; patterning the nitride film; forming a first conductive film which serves as a barrier so as to be in contact with the nitride film; forming a second conductive film including aluminum so as to be in contact with first conductive film; and thereafter selectively performing a heat treatment under reduced pressure or in normal pressure, and flattening the second conductive film.

44 Claims, 8 Drawing Sheets

U.S. PATENT DOCUMENTS

| | | | |
|---|---|---|---|
| 5,843,843 A | 12/1998 | Lee et al. | |
| 5,844,318 A | 12/1998 | Sandhu et al. | |
| 5,846,877 A | 12/1998 | Kim | |
| 5,869,902 A | 2/1999 | Lee et al. | |
| 5,880,023 A * | 3/1999 | Jun | 438/652 |
| 5,913,146 A | 6/1999 | Merchant et al. | |
| 6,001,727 A | 12/1999 | Ohmi et al. | |
| 6,057,234 A | 5/2000 | Yamazaki | |
| 6,171,961 B1 | 1/2001 | Yamazaki et al. | |
| 6,194,315 B1 | 2/2001 | Hu et al. | |
| 6,225,218 B1 | 5/2001 | Yamazaki et al. | |
| 6,436,827 B1 | 8/2002 | Yamazaki et al. | |
| 6,545,359 B1 * | 4/2003 | Ohtani et al. | 257/758 |
| 2001/0011727 A1 | 8/2001 | Yamazaki et al. | |
| 2002/0197866 A1 | 12/2002 | Yamazaki et al. | |
| 2003/0111666 A1 * | 6/2003 | Nishi et al. | 257/79 |

* cited by examiner

METHOD FOR MANUFACTURING SEMICONDUCTOR DEVICE

BACKGROUND OF THE INVENTION

1. Field of the Invention

The present invention relates to a method for manufacturing a semiconductor device, which comprises a step for manufacturing a wiring by a reflow method.

2. Description of the Related Art

Recently, development for a highly integrated, high speed, and miniaturized semiconductor device has been advanced. According to the miniaturization, the length of the side can be reduced to approximately 70%. However, the reduction in a longitudinal length has not realized due to keep lower resistance. Therefore, a technique to form the wiring in a narrow and deep hole that has a large aspect ratio has been required. As a metal embedded technique by which a metal material is embedded in the trench which is formed in the insulating film in advance, metal CVD or the reflow method has been developed. The reflow method is a considerably promising technique since it can be performed in lower cost.

In order to obtain a higher speed and higher efficiency, it is important that an insulating film has a lower dielectric constant, and an organic material is preferably used. However, since the organic material has lower heat resistance, it can be resolved and damaged according to the treatment temperature. In the case of forming an embedded wiring in an insulating film including an organic material, an example is that the treatment temperature is at least 20° C. lower than the heat resistant temperature of the organic material (Reference 1: Japanese Patent Laid-Open No. 10-125783). According to the method, the embedded wiring is formed after a barrier metal film is formed over the organic insulating film thereby preventing the degasification from the organic insulating film.

When using the high pressure reflow method, an attachment apparatus has become large, since equipment such as sputtering equipment and high pressure reflow equipment whose pressures are approximately $10^7$ times different from each other are required to be connected in an inert gas or in a vacuum. Further, a manufacturing cost has been increased since it takes time to carry the substrate out or into of each the equipment.

SUMMARY OF THE INVENTION

It is an object of the present invention to provide a method for manufacturing a semiconductor device in which an attachment apparatus is simple and capable of continuous processing, thus the cost can be reduced. It is a further object of the present invention to provide a method for manufacturing a semiconductor device in which a wiring with favorable coverage can be formed in a contact hole with a large aspect formed over an organic insulating film with a lower heat resistant temperature. A still further object of the present invention is to provide a method for manufacturing a semiconductor device wherein wiring capacity can be reduced and multilayer wiring can be manufactured by using an organic insulating film of a lower dielectric constant.

In order to solve the above-mentioned problems, the following steps are taken in the present invention.

A method for manufacturing a semiconductor device wherein a wiring filling the opening portion is formed over an organic insulating film having the opening portion for making a contact with a lower part of the layer, comprises steps of forming a first conductive film which serves as a barrier over the organic insulating film and in the opening portion, forming a second conductive film including aluminum over the first conductive film, and flattening by heating the second conductive film selectively under reduced pressure or in normal pressure (atmospheric pressure). Further, steps from forming the first and the second conductive films to the selective heat treatment are performed successively without exposing to the atmosphere.

As another method for manufacturing a semiconductor film, the following steps may be carried out: forming a nitride film over the organic insulating film and in the opening portion; patterning the nitride film so that the lower part of the layer is exposed; forming a first conductive film including titanium, tantalum, or tungsten over the nitride film; and forming a second conductive film including aluminum over the first conductive film. In this case, the nitride film prevents the degasification from the organic insulating film.

A third conductive film is formed over the second conductive film. A film including one or more elements selected from germanium (Ge), tin (Sn), gallium (Ga), zinc (Zn), lead (Pb), Indium (In), or scandium (Sb) may be formed.

More particularly, a method for manufacturing a semiconductor device comprising a step of forming an embedded wiring in an insulating film including an organic material or performing embedding of the wiring in a contact hole, the steps are performed by a short heat treatment under reduced pressure or in normal pressure. As the heat treatment, light from ultraviolet (UV) to infrared in which flowability can be enhanced by heating the conductive material are used. Then, gas laser irradiation or solid-state laser irradiation which performs pulsed oscillation or continuous oscillation, or lamp in which light from UV to infrared is emitted is used. Since the heat treatment is performed at short times, non-equilibrium state is kept thermally. Furthermore, since the organic insulating film is not heated, the organic insulating film is not destroyed. When the heat treatment is performed, the substrate may be heated, preferably the substrate is heated at equal to or less than 550° C.

Al, or Al alloy in which Sc, Si, Cu, Ti, or the like are added to the Al by 0.01 wt % to 5 wt % is preferably used as the wiring material. By using a material including an element selected from Ge, Sn, Ga, Zn, Pb, In, Sb, and the like, or by forming a lamination of thin films including the element over the Al film, the flowability is preferably improved by the heat treatment and the heat treatment temperature is preferably lowered. Specifically, the conductive film typified by an Al film can be efficiently heated with the laser light or the lamp by forming the lamination of the conductive films including the element having lower reflectivity over the upper layer of the conductive film typified by an Al film.

As a material with lower dielectric constant, preferably which is an insulating film having relative dielectric constant of at most 4.0, for example, an organic material such as acrylic, polyamide, polyimidamide, epoxyacrylic, benzocyclobutene, parylene, flare, or polyimide having transparency may be used.

A siloxanes material may be used for the material having lower dielectric constant. The siloxanes material has a skeleton structure with a bond of silicon (Si) and oxygen (O) and corresponds to the one at least including hydrogen in the substituent or the one at least including a kind of fluorine, alkyl group, or aromatic hydrocarbon in the substituent.

Because the present invention having the above structure is performed in normal pressure or under reduced pressure, continuous processing can be performed by using a load lock mechanism, and it can be realized in lower cost. According to the present invention, the contact hole can be filled by the short heat treatment at; therefore, a wiring having a favorable coverage can be formed in an organic insulating film having lower heat resistance temperature. Further, by using the organic insulating film with lower dielectric constant, a wiring capacity can be reduced and multilayer wiring can be obtained, thereby a semiconductor device with higher performance and advanced function can be realized.

DETAILED DESCRIPTION OF THE INVENTION

Hereinafter, embodiment modes of the present invention are described with reference to the drawings. However, the present invention can be carried out in many different modes. And it is easily understood by those skilled in the art that the mode and the details of the present invention can be variously changed without departing from the purpose and the scope of the invention. Therefore, the interpretation is not limited to the description of the embodiment modes in the present invention. In the present invention described as below, like numerals which denote the same are used commonly in the drawings.

[Embodiment Mode 1]

The embodiment mode of the present invention is described with reference to FIGS. 1A to 1C. A glass substrate formed of barium borosilicic acid glass, alumino borosilicic acid glass, and the like, a quartz substrate, a silicon substrate, a metal substrate, a stainless substrate, or a plastic substrate having heat resistance that can resist the treatment temperature in the manufacturing steps are used as a substrate 10 (FIGS. 1A to 1F).

An organic insulating film 20 and a wiring 19 are formed over the substrate 10. In this embodiment, only the wiring 19 is illustrated, however, a base film or a semiconductor layer that is to have a contact may be formed.

An organic insulating film 11 is formed with a thickness of 0.3 μm to 5 μm (preferably 0.5 μm to 2.0 μm) over the substrate 10 by SOG (Spin On Glass) or spin coating. A material with lower dielectric constant, preferably the material with relative dielectric constant of at most 4.0 is used as the material for the organic insulating film 11. For example, an organic material such as acryl, benzocyclobutene, parylene, flare, or polyimide having transparency is preferably used.

Since the organic insulating film 11 is superior in the flattenness, even the conductive material is reflowed later, the film thickness does not become extremely thin and disconnection is not occurred on uneven potions, either. Further, in the case of using a material with lower dielectric constant as an interlayer insulating film, the wiring capacity is reduced. Therefore, the multilayer wiring can be formed, and high efficiency and high function semiconductor device can be acquired.

Next, by using a photolithography technique, the organic insulating film 11 is pattern processed, thereby forming a contact hole. Either of wet etching or dry etching may be used, however it is preferable to use the dry etching because a contact hole with higher aspect ratio of more than 3 can be formed. The lower wiring 19 is in an exposed state after this contact hole is formed.

Thereafter, by using a publicly known method such as sputtering, the first conductive film (referred to as barrier film) 12 is formed. For example, Ti (titanium) film is formed with a thickness of 20 nm by using Ar (argon) or Ar and nitrogen gas as an ambient atmosphere gas, TiN (titanium nitride) film is laminated thereover with a thickness of 50 nm. This Ti/TiN film shall be a barrier film 12. In addition, a silicide film such as TiSix and MoSix ensuring wettability with Al and a material such as a polysilicon film, Nb (niobium), TiON (titanium oxide nitride), W (tungsten), WN (tungsten nitride), TiWN (titanium tungsten nitride), or Ta (tantalum) may be used for the material for the barrier film 12 without limitation to Ti and TiN. In addition, barrier film 12 may have either a single layer structure or a laminated structure. The barrier film 12 increases the adhesion, provides for easier embedding, and makes the contact resistance reduced and stabilized.

Next, a second conductive film (hereinafter referred to as conductive film) 13 is formed over the barrier film 12. More in detail, by a publicly known method such as a sputtering method, the conductive film 13 is formed with a thickness of 0.3 μm to 2 μm by using aluminum (Al), or a material based on the aluminum, copper (Cu), a material based on copper, or an alloy material thereof. The barrier film 12 and the conductive film 13 can be sequentially formed by sputtering. In addition, an alloy material of Al and/or Cu and one or more elements selected from germanium (Ge), tin (Sn), gallium (Ga), zinc (Zn), lead (Pb), indium (In) and scandium (Sb) may be used for the conductive film 13. When an alloy material mixed with such element is used, a melting point is dropped, and treating temperature in a reflow step can be decreased.

Subsequently, after the conductive film 13 is formed, it is heat treated in normal pressure or under reduced pressure without exposing to the atmosphere. By reflowing (fluidizing) aluminum, a contact hole can be effectively filled with the aluminum, and a conductive film 15 with a surface flattened can be formed (FI. 1B). This heat treatment is carried out by laser irradiation or rapid thermal annealing at short times so that the temperature of the conductive film 13 becomes higher than recrystallization temperature and the conductive film 13 has flowability. At this time, the substrate may be heated so that reflow can be effectively carried out. The temperature depends on the material of the insulating film, generally, it is from 200° C. to 550° C., preferably, 250° C. to 450° C. Thus, in the reflow method, after the wiring material is formed, the formed wiring material is heated at least at the recrystalization temperature and at most at the melting point and softened so that the flowability of the material is increased and flowed into the contact hole, thereby filling the contact hole with the wiring material.

In the case of laser irradiation, continuous oscillation or pulsed oscillation of a gas laser or a solid-state laser may be used. As the gas laser, an excimer laser, a YAG laser and the like can be noted, and as the solid-state laser, a laser using a crystal of such as YAG or $YVO_4$ which is doped with Cr or Nd can be noted. In order to obtain large crystal grain when the amorphous semiconductor film is crystallized, the solid-state laser capable of continuous oscillation is used and the second to fourth harmonic of fundamental harmonic is preferably used. When the laser is used, the laser light emitted from the laser oscillator is condensed in a linear shape with an optical system, and the laser light irradiates a semiconductor film. The condition of the crystallization is properly set, however in the case of using the excimer laser, the frequency of the pulsed oscillation is set at 300 Hz and the density of the laser energy is set at 100 to 700 $mJ/cm^2$ (preferably from 200 to 300 $mJ/cm^2$). Further, when the YAG laser is used, the second harmonic is used with the pulse frequency set from 1 to 300 Hz, and the laser energy density set from 300 to 1000 mJ/cm² (preferably from 350 to 500 MJ/cm²). The laser light that is condensed into a linear shape with a width of 100 to 1000 μm, preferably 400 μm; the entire surface of the substrate may be irradiated with the laser light. The irradiation is performed with an overlap ratio of 50 to 98% for the linear shape laser light. It is preferable to use a continuous oscillation type laser in relation to the absorptance of laser light. In addition, it is preferable to devise incident angle of the laser light to prevent reflected light from the conductive film 13. Moreover, so-called hybrids laser irradiation method combined pulsed and continuous oscillation may be used. The heat treatment using laser irradiation is instantaneously carried out within several microseconds to several minutes so as not to damage the organic insulator film 11.

In addition, rapid thermal annealing (RTA) is carried out by raising the temperature rapidly and heating for several microseconds to several minutes by using an infrared lamp or a halogen lamp emitting light from ultraviolet to infrared in an inert atmosphere. Since the treatment is performed instantaneously, only the top surface of the thin film is heated substantially and the damage is not given to the lower films. Incidentally, when the rapid thermal annealing is performed, continuous processing can be carried out by changing the temperature in the chamber after the formation of the conductive film 13

When performing the both of the heat treatment, the conductive film 13 is formed over the entire surface, thereby the organic insulating film 11 is protected and not to be damaged. In addition, since the heat treatment is performed at short times, non-equilibrium state is realized thermally, and thus the heat is not conducted to the organic insulating film 11.

The conductive film 15 which is based on Al is easily oxidized; however, it is preferable to use when the heat treatment is carried out under reduced pressure where an oxide film is not formed on the surface of the conductive film 15. In addition, in the case of performing the heat treatment in normal pressure, it is required to sufficiently lower the partial pressure of oxide gas of such as oxygen and water in atmosphere, or to perform the heat treatment in an inert atmosphere. Fluidization (reflow) of conductive film 15 is remarkably obstructed if a natural oxide film is formed on the surface of the conductive film 15. Therefore, the contact hole can not be filled.

In addition, in the case of forming a Ti/TiN film as a barrier film, for example, heat treatment may be performed after pattern processing of TiN film and Al film in the upper layers. In this case, the organic insulating film 11 is not damaged even if the heat treatment is performed because the top surface of the organic insulating film 11 is covered with the Ti film.

Then, the conductive film 15 is patterned processed by photolithography technique, thereby forming a wiring 16. (FIG. 1C) Through the steps above, a wiring with favorable coverage can be formed in the contact hole having a higher aspect ratio which is formed in the organic insulating film with lower dielectric constant.

According to a manufacturing method of this embodiment mode, heat treatment is performed over the entire surface of the conductive film at short times. Therefore, the embedded wiring 16 can be formed without damaging the organic insulating film 11. Further, because the heat treatment is performed in normal pressure or under reduced pressure, the continuous processing becomes possible by using a load lock mechanism, cost reduction can be realized. Specifically, the continuous processing of forming the barrier film 12 and the conductive film 13, and performing the heat treatment become possible.

[Embodiment Mode 2]

An embodiment mode of the present invention is described with reference to FIG. 1D to 1F.

A glass substrate having an insulating surface is used as a substrate 10, and an organic insulating film 20 and a wiring 19 are formed over the substrate 10. (FIG. 1D) Then, an organic insulating film 11 is formed over the wiring 19, and pattern processed so as to form a contact hole. The steps so far are similar to the above-mentioned Embodiment Mode 1, therefore the detail description is omitted.

Next, a nitride film 14 such as a silicon nitride film is formed by using a publicly known method (sputtering, plasma CVD, or the like). This nitride film 14 serves to prevent degasification from the organic insulating film 11. And, the wiring 19 is pattern processed so as to be exposed by using photolithography.

A barrier film 12 and an conductive film 13 are formed over the nitride film 14. Because the steps so far are also similar to those in Embodiment Mode 1, the detail description is omitted.

A third conductive film (hereinafter referred to as antireflection film) 17 suppressing reflected light of laser light is formed so as to perform the heat treatment of the following steps with higher precision. An insulating film such as a silicon oxide film, a silicon nitride film, a silicon nitride oxide film, or a silicon oxynitride film which is formed by a publicly known method of sputtering, plasma CVD or the like, or a conductive film including a kind or plural kinds of elements selected from Ge, Sn, Ga, Zn, Pb, In, Sb, or the like which is formed by the publicly known method is used as the antireflection film 17. However, in the case of using the conductive film including a kind or plural kinds of elements selected from Ge, Sn, Ga, Zn, Pb, In, Sb or the like, the melting point is dropped, thereby lowering the temperature of the heat treatment.

Next, three layers of the barrier film 12, the conductive film 13, and the antireflection film 17 are pattern processed by using the nitride film 14 as an etching stopper. (FIG. 1E)

Subsequently, the heat treatment is performed in ordinary pressure or under reduced pressure without exposing to the air, thereby reflowing aluminum (fluidizing aluminum). Therefore, the contact hole can be efficiently filled with the aluminum, and a conductive film 18 having a flattened surface can be formed. (FIG. 1F) This heat treatment is carried out by irradiation of laser light or rapid thermal annealing so that the conductive film has the temperature of more than that in the recrystallization, and has flowability.

In addition, in this embodiment mode, the example of forming the antireflection film 17 is illustrated, however, the reflected light may be controlled by making the surface of the conductive film 13 uneven without forming the antireflected film 17.

According to a manufacturing method of this embodiment, the heat treatment is performed at short times; therefore the embedded wiring 18 can be formed without damaging the organic insulating film 11.

Further, because the heat treatment is performed in ordinary pressure or under reduced pressure, the continuous treatment can be realized by using a load lock mechanism, and the heat treatment can be performed in lower cost. Specifically, the continuous treatment of forming and heating of the barrier film 12 and the conductive film 13 can be performed.

In this embodiment mode, the heat treatment is performed after performing the pattern processing, however, the present invention is not limited thereto. And the heat treatment can be performed before the pattern processing as described in Embodiment Mode 1. In this case, the organic insulating film can be protected since the heat treatment can be performed in the state where the organic insulating film is covered with the conductive film entirely. This embodiment mode can be freely combined with the above embodiment mode.

[Embodiment Mode 3]

The present invention comprises a step of forming a conductive film so as to be in contact with an organic insulating film in which an opening portion is formed. The organic insulating film may be formed of a material of siloxanes in addition to the above mentioned polyimide, acryl, or the like. The material of the siloxanes corresponds to a material wherein a skeletal structure is formed with a bond of silicon (Si) and oxygen (O) and a substituent contains at least hydrogen, or a material including at least one of fluorine, alkyl group, and aromatic hydrocarbon in the substituent. The thin film formed by using the siloxanes material is formed by SOG, spin coating, or the like as is the case with the materials of the acryl, the polyimide, or the like with a thickness of from 0.3 µm to 5 µm (preferably, from 0.5 µm to 2 µm). In addition, the formation of the opening portion is carried out by a photorithography technique.

By using an organic insulating film of a low dielectric constant, transmission of signal with the use of the wiring can be speeded up, multilayer wiring is realized by reducing wiring capacity, and higher performances and higher functionality can be realized.

[Embodiment 1]

A embodiment of the present invention is described with reference to FIG. 2.

FIG. 2 is a cross sectional view of a semiconductor device in which six layers is formed over a substrate 10. An example that the first layer is a semiconductor element (here, only a thin film transistor), and the second to the sixth layers are wirings is shown.

When such the multilayer wiring is formed, the component ratio of one kind or plural kinds of conductive materials selected from the group consisting of Ge, Sn, Ga, Zn, Pb, In, or Sb is preferably increased from the lower layer toward the upper layer. Accordingly, the treatment temperature in the reflow step can be reduced from the lower layer toward the upper layer.

A semiconductor device including the multilayer wiring is preferably used for the function circuit in which a plurality of semiconductor elements such as CPU is required to be incorporated. Temporarily, in the case of not forming the multilayer wiring, the wiring is required to be manufactured in the same layer as the gate electrode, or the source/drain wiring of the semiconductor element (here, the thin film transistor) which are formed in the first layer. Accordingly, the wiring is required to be led, therefore the yield get worse by just that much. Furthermore, in this case, miniaturization of the semiconductor device may not be realized except reducing the size of the semiconductor element.

On the other hand, according to a method for manufacturing a semiconductor device of the present invention, the multilayer wiring can be manufactured by using the organic insulating film of a lower dielectric constant. And higher integration becomes possible by narrowing the width between the elements in the first layer, thereby manufacturing a wiring thereover. Therefore, the steep miniaturization can be realized. Because the wiring is not required to be further led, lower resistance can be obtained and higher speed can be realized.

This embodiment can be freely combined with the above-mentioned embodiment modes.

[Embodiment 2]

In this embodiment, a manufacturing step of forming an n-channel type transistor and a p-channel type transistor over the same substrate is described with reference to the drawings.

An insulating film including silicon such as a silicon nitride oxide film or a silicon oxynitride film is formed into a single layer or a laminated layer over a substrate 300 having an insulating surface as a base film 302 by a publicly known method (plasma CVD or the like)

Next, an amorphous semiconductor film is formed with a thickness of 25 nm to 100 nm by a publicly known method (sputtering, LPCVD, plasma CVD, or the like). Subsequently, the amorphous semiconductor film is crystallized by a publicly known method for crystallization (a laser crystallization method, a thermal crystallization method using RTA or an annealing furnace, a thermal crystallization method using a metal element which promotes the crystallization, or the like). Thus the obtained crystalline semiconductor film is patterned into a desired shape, thereby forming semiconductor layers 307 and 308. An amorphous semiconductor film, a microcrystal semiconductor film, a crystalline semiconductor film, or a compound semiconductor film having an amorphous structure such as an amorphous silicon germanium film is used.

Thereafter, a gate insulating film 317 for covering the semiconductor layers 307 and 308 is formed. The gate insulating film 317 is formed of an insulating film including silicon with a thickness of from 30 nm to 200 nm by sputtering, for example.

Subsequently, a first conductive film 318 with a thickness of from 20 nm to 100 nm is formed by using an element selected from Ta, W, Ti, Mo, Al, Cu, Cr, or Nd, an alloy material or a compound material which is base on the elements, or a semiconductor film typified by polycrystalline silicon film doped with an impurity element such as phosphorus, a publicly known conductive material such as AgPdCu alloy or the like. (FIG. 3B) Then, a second conductive film with a thickness of from 100 nm to 400 nm and a silicon nitride film with a thickness of from 100 nm to 400 nm are laminated so as to cover the first conductive film 318. Consequently, the insulating film of the silicon oxide film, silicon nitride film, or the like is pattern processed, thereby forming insulating layers 321 and 322. In more detail, if it is silicon oxide film, the insulating film is pattern processed by using etchant of phosphoric acids, and if it is a silicon nitride film, the insulating film is pattern processed by using etchant of hydrofluoric acids. The second conductive film is pattern processed by using the insulating layers 321 and 322 as a mask, thereby forming conductive layers 319 and 320.

Next, a doping treatment is carried out. At this treatment, an impurity element imparting an n-type conductivity and belonging to a group 15 in the periodic table such as phosphorus or arsenic is doped into the semiconductor layers 307 and 308 at lower concentration. At this time, the conductive layers 319 and 320 and the insulating layers 321 and 322 serve as a mask toward the impurity element imparting the n-type conductivity. Thus, impurity regions 324 and 325 can be formed in a self-aligned manner, and the impurity element imparting the n-type conductivity is added within the concentration range of $1\times10^{18}$ to $1\times10^{20}$ atoms/cm$^3$.

Next, anisotropic side etching is carried out so as to cutback on the conductive layers 319 and 320, thereby forming conductive layers 326 and 327 (FIG. 3C).

Thereafter, the insulating layers 321 and 322 which serve as the mask are removed by etching. (FIG. 3D) Next, a mask 328 formed of a resist is newly formed and a doping treatment is performed with higher acceleration voltage than that in the above doping treatment. As a result of performing the doping treatment by using the conductive layer 326 as a mask toward an impurity element, the impurity element imparting the n-type conductivity is added to an impurity region 329 (N-region, LDD region) within the concentration range of from $1\times10^{18}$ atoms/cm$^3$ to $5\times10^{19}$ atoms/cm$^3$, and the impurity element imparting n-type conductivity is added to an impurity region (N+region) within the concentration range of from $1\times10^{19}$ atoms/cm$^3$ to $5\times10^{21}$ atoms/cm$^3$. In addition, a channel-forming region 331 is formed.

After removing the mask 328 formed of the resist, a mask 332 formed of a resist is newly formed. (FIG. 3E) Then, an impurity region added with an impurity element imparting the opposite conductive type to the first conductive type is formed in a semiconductor layer which serves as an active layer of the p-channel type TFT by performing doping treatment. In this treatment, an impurity region (p+region) 333, an impurity region (p−region) 334, and a channel forming region 335 are formed in a self aligned manner by using the conductive layer 327 as a mask toward the impurity element and adding an impurity element imparting p-type conductivity. Here, the doping is performed so that the concentration of the impurity element imparting the p-type conductivity is from $1\times10^{19}$ atoms/cm$^3$ to $5\times10^{21}$ atoms/cm$^3$. Note that the condition of the doping treatment is not limited to the description, and it may be performed plural times that is at least two times of doping treatment.

Next, conductive layers 336 and 337 are formed by removing the mask 332 formed of a resist and anisotropically etching the first conductive film 318 by using the conductive layers 326 and 327 as a mask. (FIG. 4A) According to the above-mentioned steps, an n-channel type transistor 338 and a p-channel type transistor 339 can be formed over the same substrate.

Subsequently, an insulating film 341 is formed. An insulating film including silicon is formed into a single layer or a laminated layer so as to have a thickness of from 100 nm to 200 nm by plasma CVD or sputtering. In this embodiment, a silicon oxynitride film is formed with a thickness of 100 nm by plasma CVD. By performing heat treatment, recovery of crystallinity of the semiconductor layer or activation of an impurity element added into the semiconductor layer may be carried out.

Then, an organic insulating film 348 is formed over the insulating film 341. An organic insulating film such as a silicon oxide film, polyimide, polyamide, acryl, or the like applied by SOG is used as the organic insulating film 348. The insulating film 348 relieves irregularity which is generated according to a TFT formed over a substrate 200 and forms a flat surface, and therefore, a film which is superior in the flatness is preferably used.

Next, the organic insulating film 348 is pattern processed by photolithography, thereby forming a contact hole which reaches the insulating film 341. Then, a nitride film 342 is formed by plasma CVD or the like so as to cover the contact hole. (FIG. 4B) This nitride film 342 serves to prevent degassing from occurring from the organic insulating film 348.

The gate insulating film 317, the insulating film 341, and the nitride film 342 are pattern processed by photolithography, thereby forming a contact hole which reaches the impurity regions 330 and 333. (FIG. 4C) Next, a barried film 349 is formed by using titanium or a material including titanium in major proportions, and consequently, a conductive film 347 is formed by using aluminum or a including aluminum in major proportions with a thickness of from 0.3 μm to 2 μm. (FIG. 4D)

Subsequently, after forming the conductive film 347, the heat treatment is carried out without exposing to air in normal pressure or under reduced pressure. Aluminum is reflowed and filled in the contact hole, thereby forming the conductive film with a flatten surface. This heat treatment is carried out by laser light irradiation or rapid thermal annealing. The heat treatment may be carried out after pattern processing, and in this case, the conductive film is preferably left over the gate electrode so as to protect the gate electrode of the transistor.

Next, the conductive film 347 which is flattened by the heat treatment is pattern processed, thereby forming wirings 343 to 346. (FIG. 4F) Thereafter, by laminating the wirings, a semiconductor device shown in FIG. 2 is completed.

A transistor which is used as the function circuit typified by CPU and the like preferably has an LDD structure or a GOLD structure. The transistor is preferably miniaturized for obtaining high speed. The transistors 338 and 339 obtained according to this embodiment have the LDD structure. Therefore, the transistors are preferably used as the function circuit not only as controlling a display element. With miniaturization, it is in dispensable that the gate insulating film 317 is to be a thin film. According to the steps of this embodiment, the doping treatment is performed while the gate insulating film 317 is covered with the first conductive film 318, and the gate insulating film 317 is protected, therefore it can be an effective manufacturing method for the miniaturization.

This embodiment can be combined with other embodiment modes and embodiments.

[Embodiment 3]

The embodiment mode of the present invention is described with reference to FIGS. 5A to 5C. In this embodiment, a panel mounted with a pixel portion, a driver circuit for controlling the pixel portion, a memory and CPU over the same surface is described. FIG. 5A is a top view of a display panel formed by sealing substrate where a TFT is formed with a sealant. FIG. 5B is a cross-sectional view taken along the line B–B' of FIG. 5A, and FIG. 5C is a cross-sectional view taken along the line A–A' of FIG. 5A.

FIG. 5A shows appearance of the panel. The panel comprises a pixel portion 401 in which plural pixels are arranged in matrix over a substrate 400, and a signal line driver circuit 402 and a scanning line driver circuit 403 for controlling the pixel portion 401. And, the sealant 407 is provided so as to surround them. A counter substrate 409 may be provided for only over the pixel portion 401, the drive circuits 402 and 403, or for the entire surface. However, a CPU 406 having a risk of generation of heat is preferably arranged to be in contact with cooling body. Either of non volatile or volatile memory may be used for a memory 405, and, for example, the memory 405 is equivalent to VRAM (memory for a screen display) or RAM.

Over the substrate 400, an input terminal part 411 to transmit signal to the signal line driver circuit 402 and the scanning line driver circuit 403 is installed, and a data signal such as a video signal is transmitted to the input terminal part 411 through an FPC 412. The cross-section view is shown in FIG. 5B. An Input wiring 413 comprising a wiring formed with the scanning line or signal line and wiring 415 installed in a side of the FPC 412 are electrically connected by using a resin 417 in which a conductor 416 is scattered. In addition, spherical high polymer compound that is coated with gold or silver is used as the conductor 416.

FIG. 5C shows a cross-sectional view of the panel. Over the substrate 400, the pixel portion 401, the signal line driver circuit 402 and the CPU 406 are provided. A TFT 430 and a storage capacitor 429 are provided for the pixel portion 401, TFTs 431 and 432 are provided for the signal line driver circuit 402, and a plurality of TFTs 440 and a wiring 441 are provided for the CPU 406.

A spacer 422 is provided between the substrate 400 including the semiconductor element such as a TFT and the counter substrate 409. The two substrates are attached to each other with a sealant 407. An orientation film 435 which are exposed to a rubbing treatment, a liquid crystal layer 423, an orientation film 424, a counter electrode 425 and a color filter 426 are provided over the pixel portion 401 and the signal line driver circuit 402. Polarizing plates 427 and 428 are provided for the substrate 400 and the counter substrate 409. In addition, a semiconductor element 440 and a wiring 441 laminated thereover are given as an element that constitutes the CPU 406.

The element constituting a circuit over substrate 400 is formed of a polycrystalline semiconductor (polysilicon) that has higher mobility and great ON current as compared with an amorphous semiconductor. That is why monolithic on the same surface can be realized. Further, a function circuit such as CPU can be integrally formed in addition to the pixel portion and the driver circuits over the same substrate 400. Such a panel is referred to as a system-on-panel, and multifunction of the system can be obtained. Because the number of the exterior IC to be connected is reduced, a small size, light, and thin panel can be realized. Accordingly, the panel is extremely effective in applying it to a portable terminal that has been rapidly spread.

This embodiment shows the case where a semiconductor element is formed as at the first layer and a wiring is laminated thereover. However the present invention is not limited thereto, and semiconductor elements (transistors) may be laminated, then wirings may be further laminated thereover. Furthermore, the semiconductor elements may be laminated by attaching the element that is formed over another substrate and peeled off by a separation method, and the wirings may be laminated thereover.

In addition in this embodiment, the panel using a liquid crystal element is shown as a display element, the present invention is not limited thereto. A panel using another display element such as a light emitting element may be used as the display element.

In FIG. 5A, the panel equipped with the memory 405 and the CPU 406 in addition to the pixel portion 401 is shown, hereinafter, a panel equipped with other than the above structure of function circuits is described follows.

FIG. 6A is a display panel, and reference numeral 450 denotes a function circuit. Then, a configuration of the function circuit 450 and the simple operation thereof are described with reference to FIG. 6B to 6D.

In FIG. 6B, the function circuit 450 comprises a memory 131, a CPU 132, a VRAM 133, and an interface 134. The function circuit 450 is formed over the same substrate as the other circuits such as a pixel integrally. The memory 131 includes a volatile memory such as SRAM, DRAM and stores an image data. In addition, the VRAM 133 includes a volatile memory such as SRAM and DRAM. The interface 134 carries out a temporary storage of a signal input by an external device, a format conversion and the like. As for the operation of the function circuit, an image data or a controlling signal supplied from an external device such as a keyboard or ROM is communicated with the CPU 132 and the external device through the interface 134 and the system bus 135. The CPU 132 stores the image data during processing and the controlling signal of the logic circuit into the memory 131 temporarily, and the processed image data is stored in the VRAM 133. The image data stored in the VRAM 133 is supplied to each pixel through the drive circuit.

In FIG. 6C, the function circuit 450 comprises a frame memory 138, a timing generation circuit 136 and a format conversion circuit 137. The function circuit is formed over the same substrate as the other circuits such as a pixel integrally. The timing generation circuit 136 generates a clock and a clock back for deciding action timing for each a driver circuit. In the format conversion circuit 137, elongation decoding of compression encoded signal input through the FPC by external device, interpolation of image and image processing such as resize are performed. The image data in which the format is converted is stored in the frame memory 138, and this stored image data is supplied to each pixel through the driver circuit.

In FIG. 6D, the function circuit 450 comprises a VRAM 133, a mask ROM 140, an image processing circuit 139, a memory 131, a CPU 132, and an interface 134. The function circuit 450 is integrally formed over the same substrate as the other circuits such as the pixel. The control signal is communicated with the external device such as the keyboard through the interface 134 and the system bus 135. A program data and an image data are stored in a mask ROM 140. The data stored in the mask ROM 140 is processed with being read and written between the mask ROM 140 and the memory 131 by the CPU 132. As for the image data, process such as resize is taken in the image processing circuit 139 and stored to the VRAM 133. The data stored in the VRAM 133 is supplied to the each pixel through the driver circuit.

The each circuit included in the above function circuit 450 mainly includes a semiconductor element. Specifically, a three-terminal element such as a transistor, a two-terminal element such as a diode, a capacitor element, a resistor element and the like can be noted. According to a method for manufacturing a semiconductor device of the present invention, the wiring can be formed over the insulating film with lower dielectric constant in the case of manufacturing a wiring that electrically connects the semiconductor element. Therefore, a multilayer wiring can be obtained with the reduced wiring capacitance. As a result, the wiring is to have lower resistance, and a high performance and high function of a semiconductor device can be realized.

The present embodiment can be freely combined with the other described embodiment mode and embodiment.

[Embodiment 4]

As an example of electric apparatuses manufactured according to the present invention, a digital camera, a sound reproduction apparatus such as a car audio, a note book type personal computer, a game machine, a portable information terminal (a cellular phone, a portable game machine, and the like), and an image reproduction device equipped with a recording medium such as a home video game machine can be noted. The specific examples thereof are described in with reference to FIGS. 7A to 7D.

FIG. 7A is a portable terminal, which includes a body 9301, a voice output portion 9302, a voice input portion 9303, a display portion 9304, an operation switch 9305, an antenna 9306, and the like. When a light emitting device of a self luminous type is used as a display element provided for the display portion 9304, because a back-light and the like is not needed, thin, small and light display portion can be obtained as compared with the case of using a liquid crystal element, thereby being extremely effective for the portable terminal as shown.

FIG. 7B is a PDA (personal digital assistant), which includes a body 9101, a stylus 9102, a display portion 9103, an operation switch 9104, and an external interface 9105 and the like. FIG. 7C is a portable game machine, which includes a body 9201, a display portion 9202, an operation switch 9203, and the like. FIG. 7D is a goggles type display, which includes a body 9501, a display portion 9502, an arm portion 9503, and the like.

In the electric apparatuses described above, the panel including display portions 9304, 9103, 9202, and 9502 is equipped with a function circuit such as a driver circuit or CPU. In addition, the driver circuit or the function circuit comprises multilayer wiring which is formed according to the present invention. As described above, because the number of IC to be connected can be reduced in the electric apparatuses having a panel in which the function circuit is integrally formed in addition to a driver circuit, a small-size, light, and thin electric apparatus can be realized and favorable.

This embodiment can be freely combined with other described embodiment modes and embodiment.

[Embodiment 5]

In this embodiment, a multi chamber that continuously performs treatment is described with reference to FIG. 8.

In FIG. 8, a transfer chamber 223 carries a substrate in and out, and also refers to as a load and unload chamber. A carrier 224 in which a substrate is set is arranged in the transfer chamber 223. A common chamber 220 includes a transport mechanism 222 that transfers a substrate 221. As the transport mechanism 22, a robot arm that performed handling of the substrate is noted.

A plurality of treatment chambers are connected to the common chamber 220 through gates 232 to 237. In FIG. 8, the common chamber 220 is set under reduced pressure (in vacuum), each treatment chamber is shut off from common chamber 220 by the gates 232 to 237. An exhaust pump is provided with the respective treatment chamber, and the processing is performed in vacuum. As the exhaust pump, an oil rotation pump, a mechanical booster pump, a turbo molecular pump, a cryopump or the like is used.

The film formation treatment chambers 240 to 242 are each a chamber where a barrier film including titanium, a conductive film including aluminum, an antireflection film including germanium are formed. When forming the thin films by sputtering, although not shown, a target, a plasma generating means using a high-frequency power supply, a gas supply means and the like are provide for the treatment chamber.

After forming the predetermined thin film in the film formation treatment chambers 240 to 242, a heat treatment for performing reflow is carried out in a laser irradiation chamber 228. The laser irradiation chamber 228 is shut off the atmosphere, which includes a position control means over which a substrate is mounted and which controls the substrate, a laser oscillation system 230, an optical system 229, a computer equipped with a memory means such as a central processing unit and a memory, and the like. In the case where the heating means is provided for the film formation treatment chambers 240 to 242, the reflow steps can be sequentially carried out by using the described means.

The heat treatment for performing the reflow step, a lamp can be used instead of using the laser irradiation. Therefore, a heat treatment chamber having the lamp may be installed in the multichamber instead of setting the laser irradiation chamber 228. Both the laser irradiation chamber 228 and the heat treatment chamber having a lamp may be provided.

Further, a processing chamber 226 for heater etching is a chamber where the predetermined etching and heating is carried out at the same time. In this multichamber, a processing chamber for CVD treating that forms a passivation film, a treatment chamber for SOG treating that forms an organaic insulating film and the like may be provided.

A semiconductor device according to the present invention can be manufactured without being exposed to the atmosphere, because the continuous treatment can be performed with all of the laser irradiation chamber and the film formation chamber provided for the multichamber having the above described structure. Thus, the semiconductor device having high-reliability can be manufactured with higher yield.

In the present invention, the embodiment modes and embodiments can be freely combined.

Figure 1A:
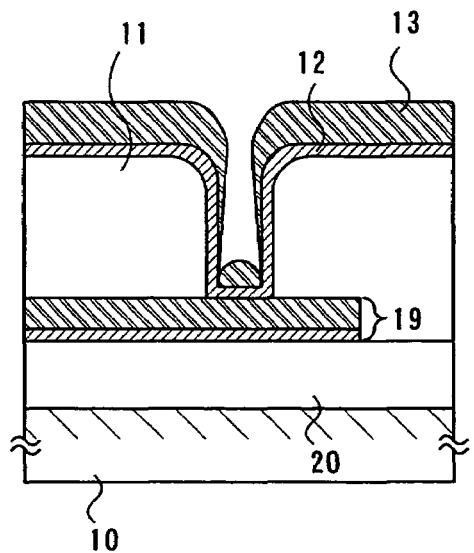
FIGS. 1A to 1F show a method for manufacturing a semiconductor device of the present invention (Embodiment Mode 1 and 2)
Figure 1D:
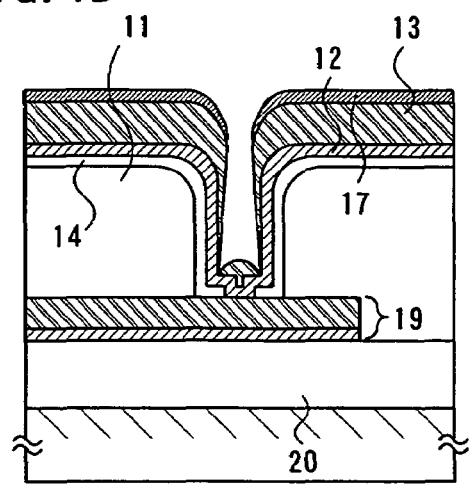
Figure 1B:
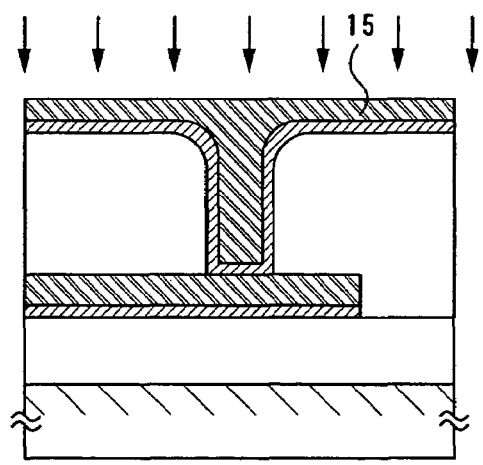
Figure 1E:
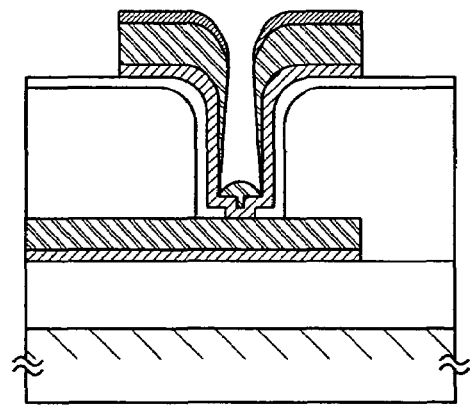
Figure 1C:
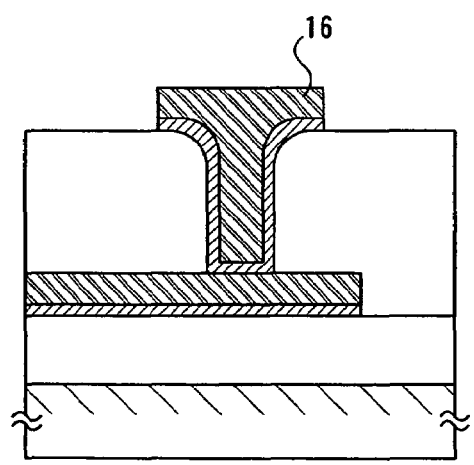
Figure 1F:
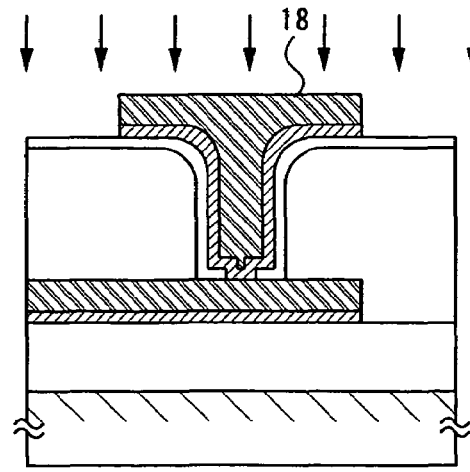
Figure 2:
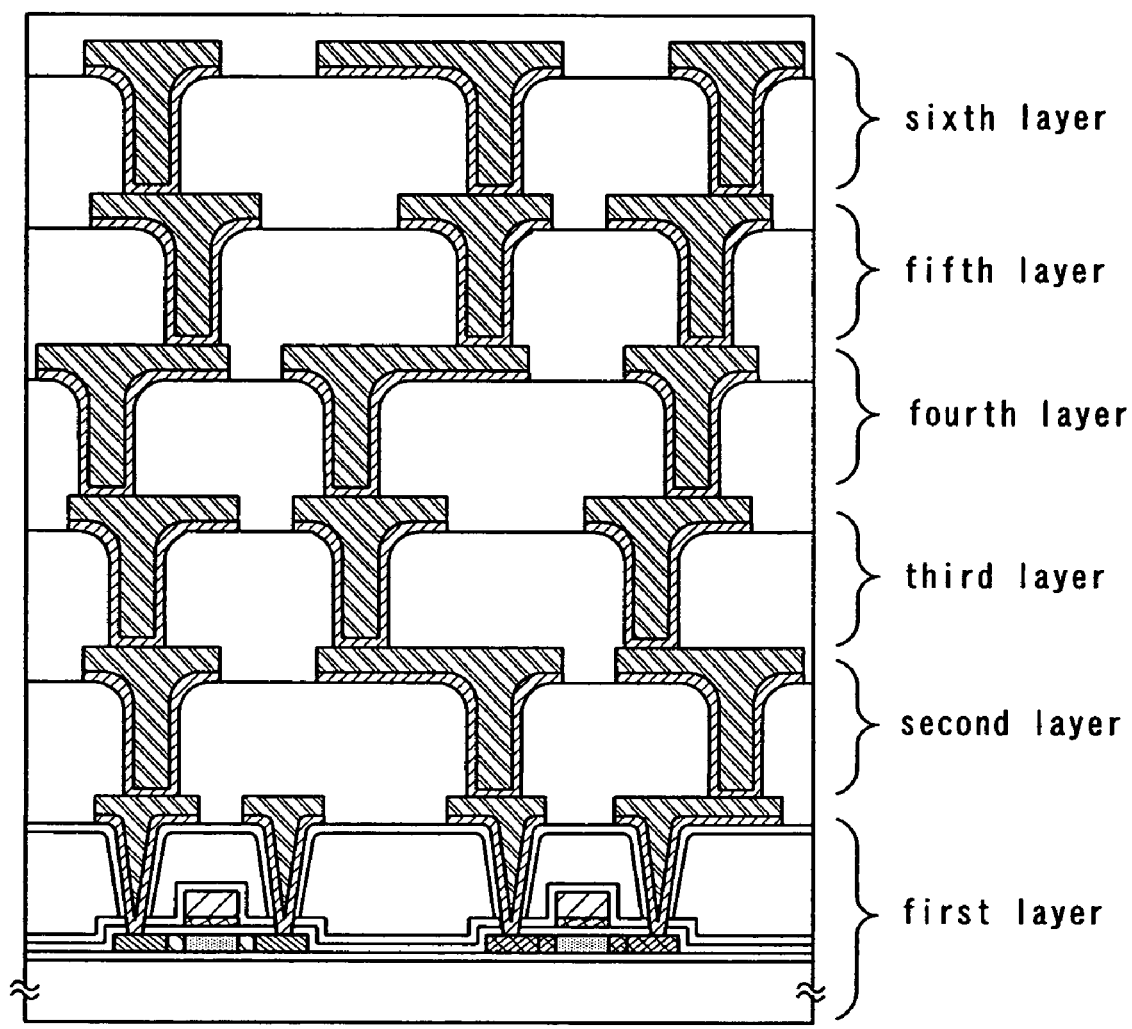
FIG. 2 shows a semiconductor device equipped with a multilayer wiring (Embodiment 1)
Figure 3A:
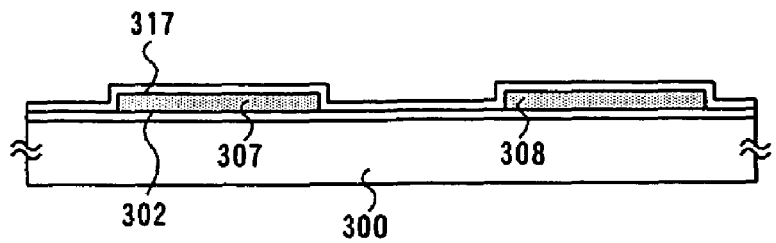
FIGS. 3A to 3E show a method for manufacturing a semiconductor device of the present invention (Embodiment 2)
Figure 3B:
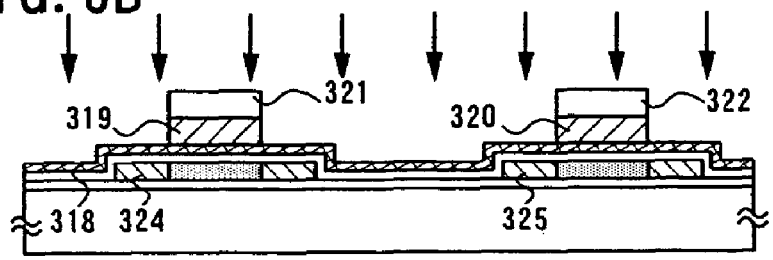
Figure 3C:
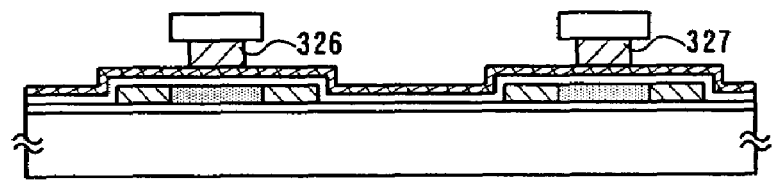
Figure 3D:
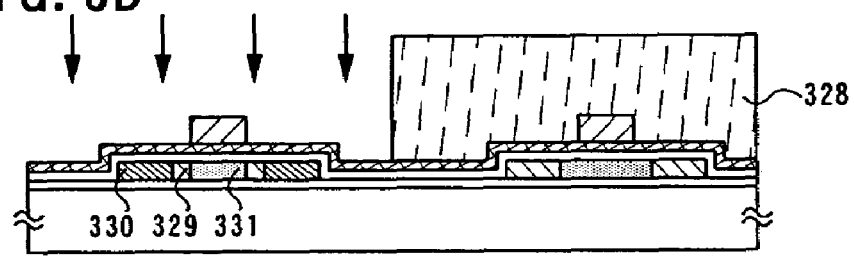
Figure 3E:
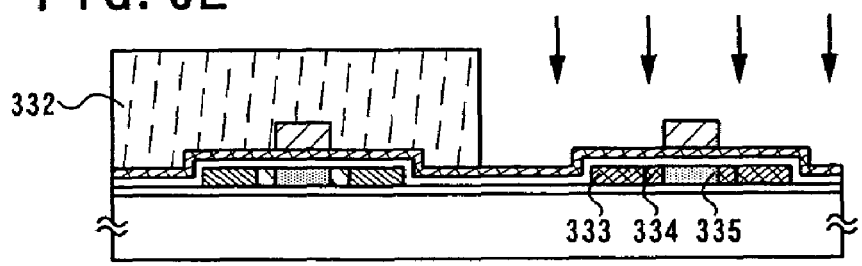
Figure 4A:
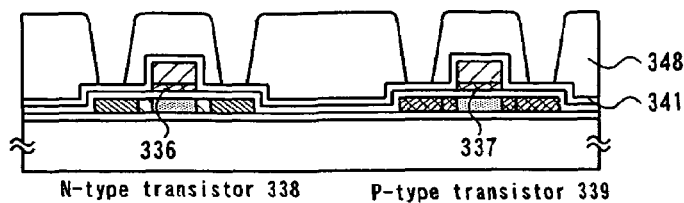
FIGS. 4A to 4F show a method for manufacturing a semiconductor device of the present invention (Embodiment 2)
Figure 4B:
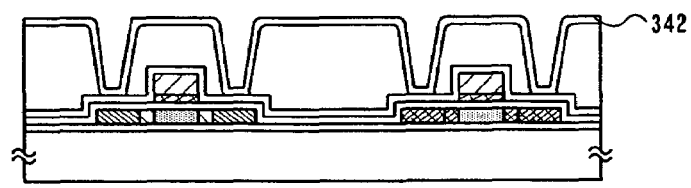
Figure 4C:
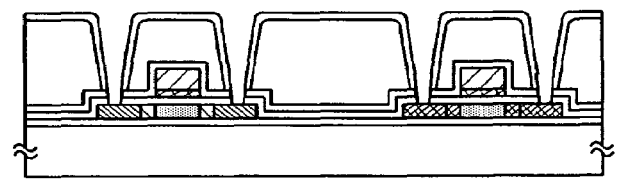
Figure 4D:
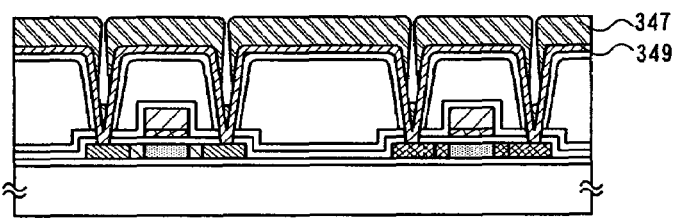
Figure 4E:
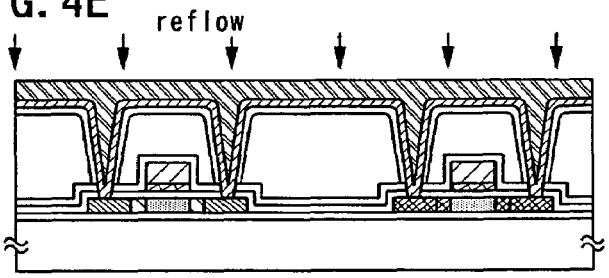
Figure 4F:
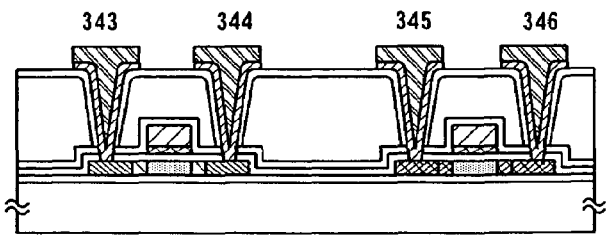
Figure 5A:
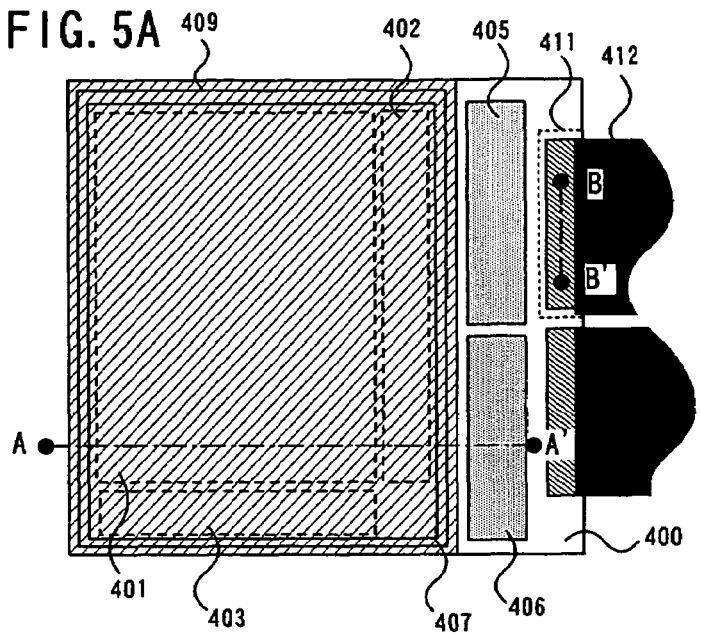
FIGS. 5A to 5C show a semiconductor device equipped with a CPU and a memory (Embodiment 3)
Figure 5B:
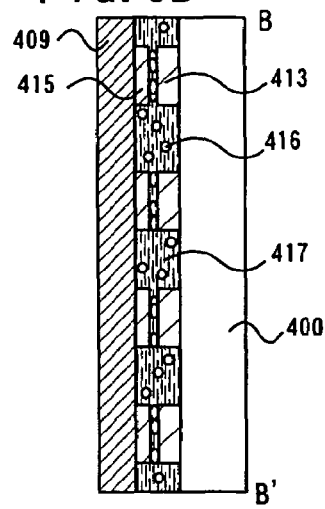
Figure 5C:
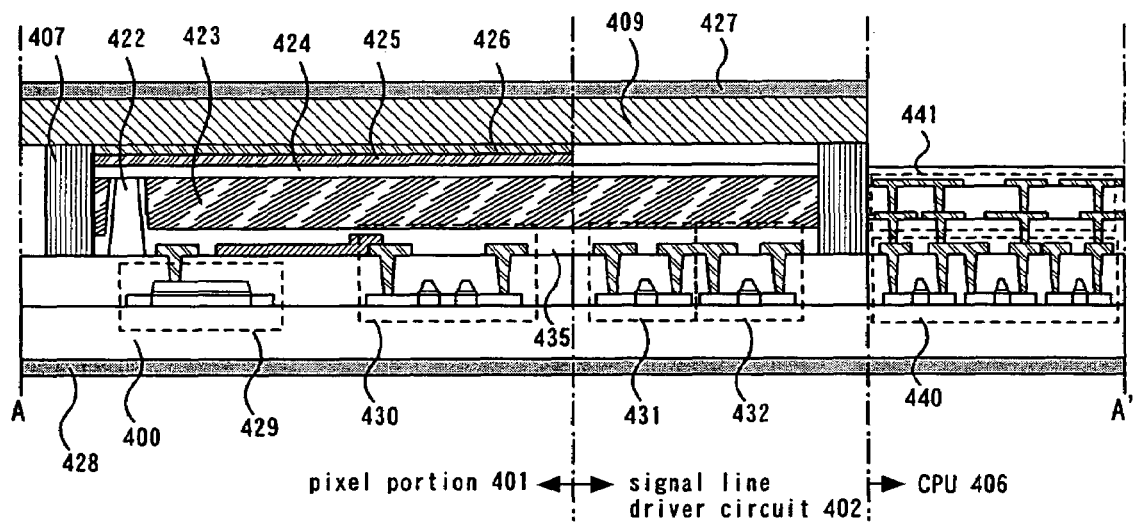
Figure 6A:
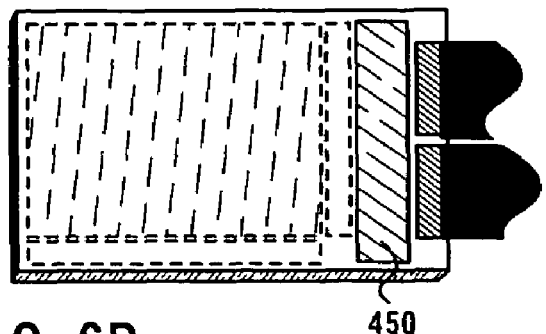
FIGS. 6A to 6D show a function circuit (Embodiment 3)
Figure 6B:
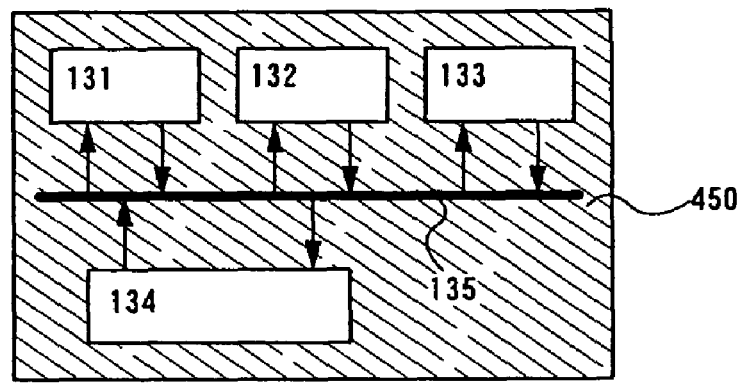
Figure 6C:
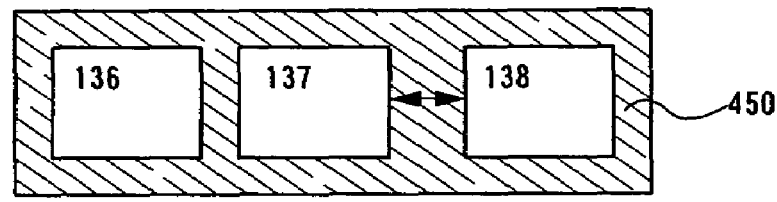
Figure 6D:
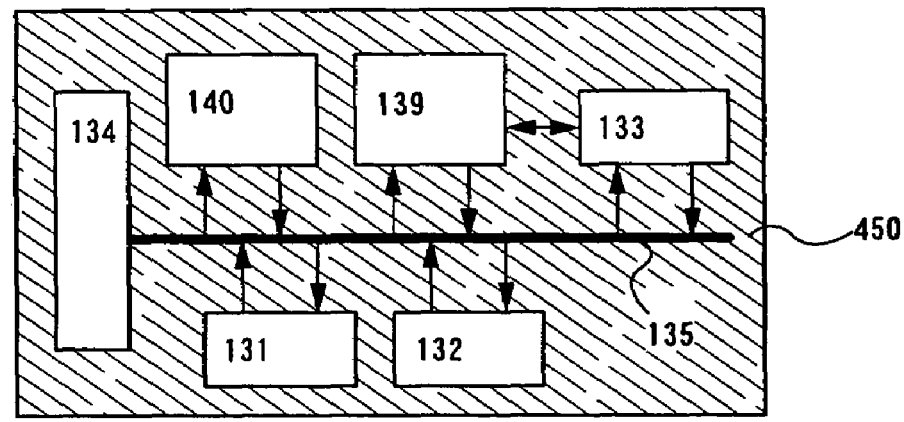
Figure 7A:
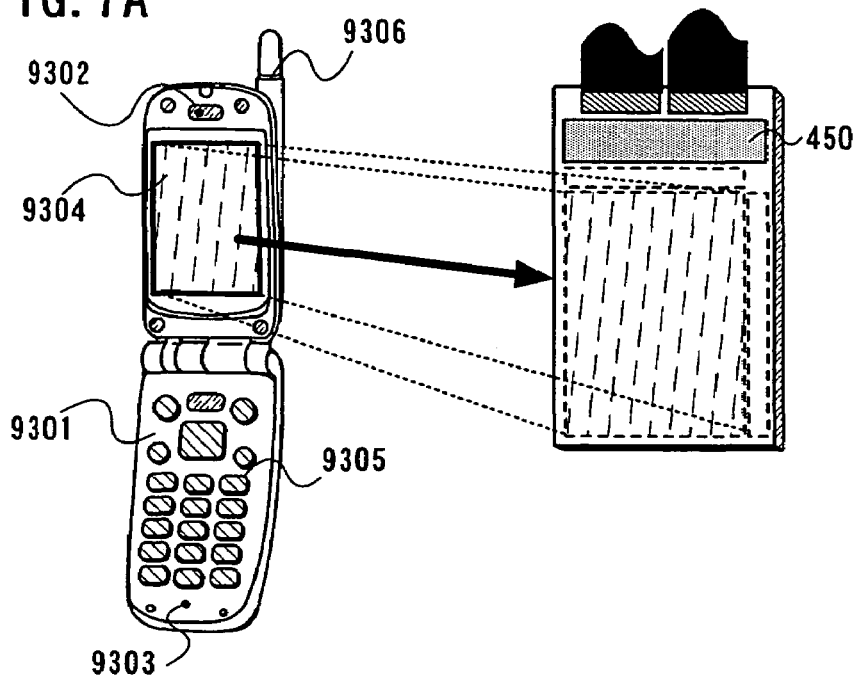
FIGS. 7A to 7D show electric apparatuses to which the present invention is applied (Embodiment 4)
Figure 7B:
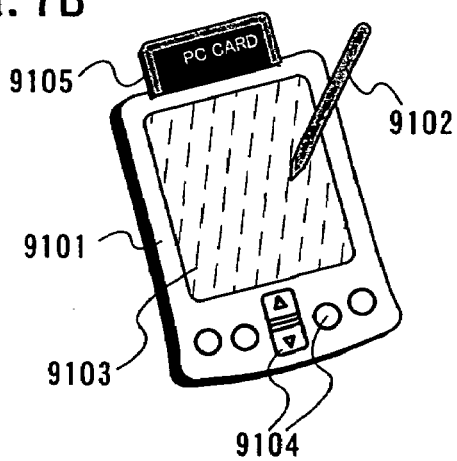
Figure 7C:
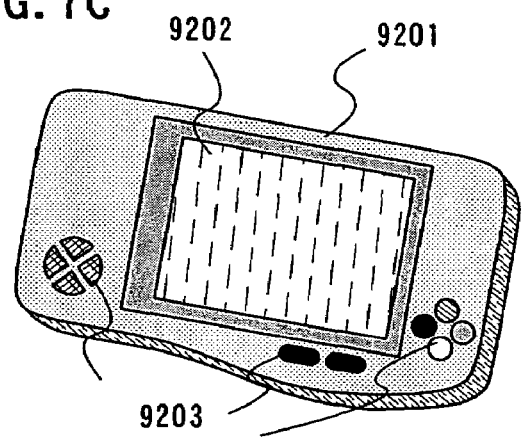
Figure 7D:
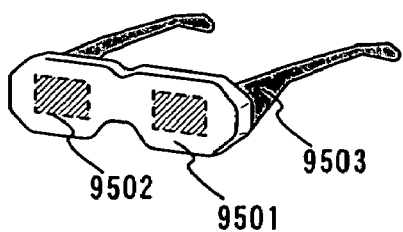
Figure 8:
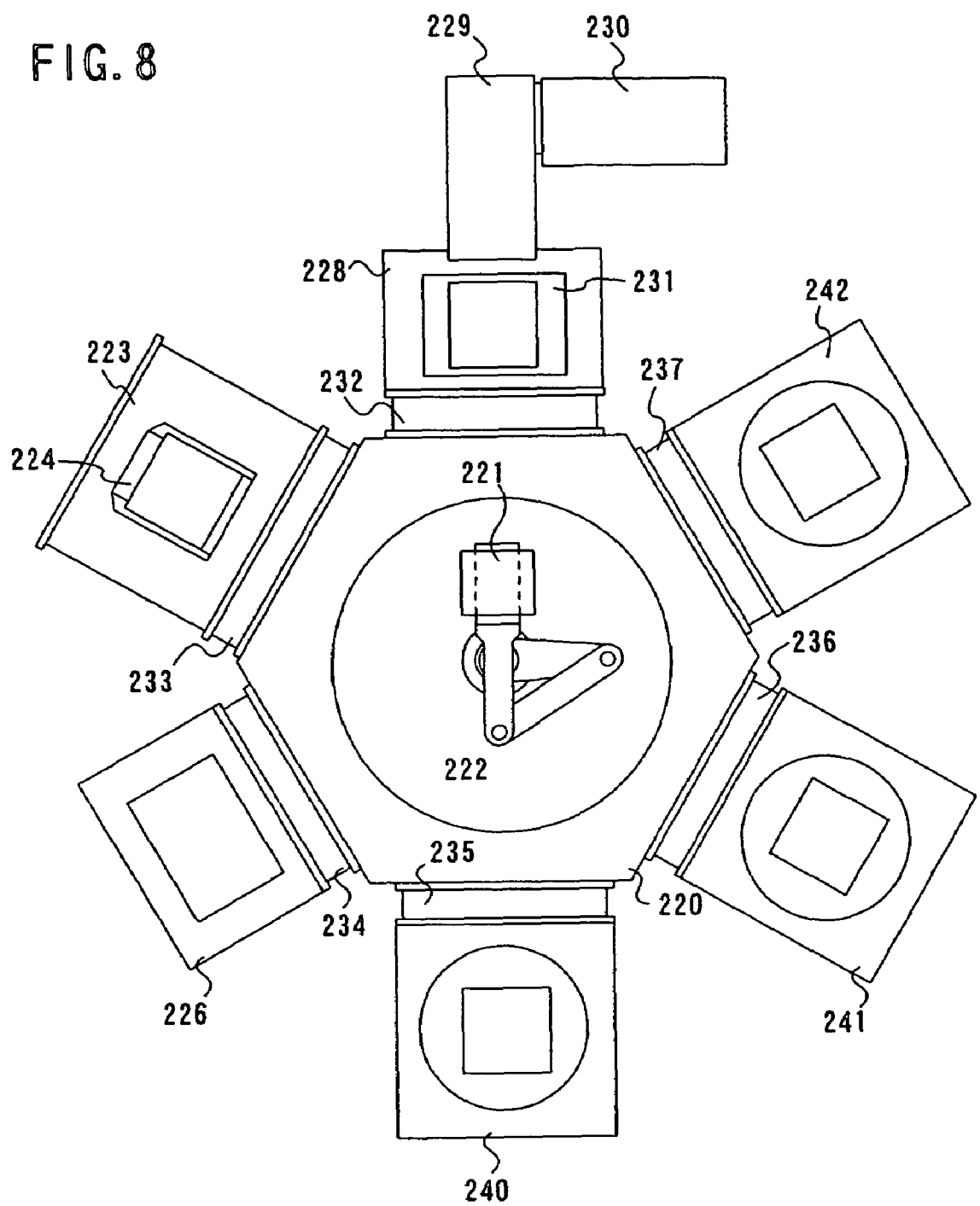
FIG. 8 is a diagram showing a chamber (Embodiment 5).

What is claimed is:

1. A method for manufacturing a semiconductor device comprising the steps of:

forming an organic insulating film;

forming an opening portion in the organic insulating film;

forming a first conductive film which serves as a barrier over the organic insulating film and in the opening portion;

forming a second conductive film including aluminum so as to be in contact with the first conductive film;

flattening a surface of the second conductive film by selectively performing a heat treatment under reduced pressure or in normal pressure; and forming a third conductive film in contact with the second conductive film.

2. A method for manufacturing a semiconductor device according to claim 1, wherein from the steps of forming the first and the second conductive film to the steps of selectively performing the heat treatment is sequentially carried out without being exposed to atmosphere.

3. A method for manufacturing a semiconductor device according to claim 1, wherein irradiation of light from ultraviolet to infrared by a lamp is used as the selective heat treatment.

4. A method for manufacturing a semiconductor device according to claim 1, wherein gas laser irradiation or solid-stare laser irradiation which performs pulsed oscillation or continuous oscillation is performed as the selective heat treatment for the second conductive film.

5. A method for manufacturing a semiconductor device according to claim 1, wherein the organic insulating film includes one kind selected from acryl, polyimide, polyamide, polyimidamide, epoxyacryl, benzocyclobutene, parylene and flare.

6. A method for manufacturing a semiconductor device according to claim 1, wherein the organic insulating film includes a skeleton structure with a bond of silicon (Si) and oxygen (O) and includes at least hydrogen in the substituent, or a film at least including a kind of a fluorine, an alkyl group, and aromatic hydrocarbon in the substituent.

7. A method for manufacturing a semiconductor device according to claim 1, wherein a film including titanium, tantalum, tungsten, or silicon is formed as the first conductive film.

8. A method for manufacturing a semiconductor device according to claim 1,
wherein the third conductive film includes one kind or plural kinds of element selected from germanium, tin, gallium, zinc, lead, indium, or scandium.

9. A method for manufacturing a semiconductor device comprising the steps of:
forming an organic insulating film;
forming an opening portion in the organic insulating film;
forming a nitride film so as to be in contact with the organic insulating film and in the opening portion;
patterning the nitride film so that a layer under the organic insulating film is exposed in the opening portion;
forming a first conductive film which serves as a barrier so as to be in contact with the nitride film and the exposed portion of the layer;
forming a second conductive film including aluminum so as to be in contact with the first conductive film; and
flattening a surface of the second conductive film by selectively performing a heat treatment under reduced pressure or in normal pressure.

10. A method for manufacturing a semiconductor device according to claim 9, wherein from the steps of forming the first and the second conductive film to the steps of selectively performing the heat treatment is sequentially carried out without being exposed to atmosphere.

11. A method for manufacturing a semiconductor device according to claim 9, wherein irradiation of light from ultraviolet to infrared by a lamp is used as the selective heat treatment.

12. A method for manufacturing a semiconductor device according to claim 9, wherein gas laser irradiation or solid-state laser irradiation which performs pulsed oscillation or continuous oscillation is performed as the selective heat treatment for the second conductive film.

13. A method for manufacturing a semiconductor device according to claim 9, wherein the organic insulating film includes one kind selected from acryl, polyimide; polyamide, polyimidamide, epoxyacryl, benzocyclobutene, parylene and flare.

14. A method for manufacturing a semiconductor device according to claim 9, wherein the organic insulating film includes a skeleton structure with a bond of silicon (Si) and oxygen (O) and includes at least hydrogen in the substituent, or a film at least including a kind of a fluorine, an alkyl group, and aromatic hydrocarbon in the substituent.

15. A method for manufacturing a semiconductor device according to claim 9, wherein a film including titanium, tantalum, tungsten, or silicon is formed as the first conductive film.

16. A method for manufacturing a semiconductor device according to claim 9, further comprising the steps of:
forming a third conductive film over the second conductive film;
wherein the third conductive film includes one kind or plural kinds of element selected from germanium, tin, gallium, zinc, lead, indium, or scandium.

17. A method for manufacturing a semiconductor device comprising the steps of:
forming an organic insulating film;
forming an opening portion in the organic insulating film;
forming a first conductive film on the organic insulating film and in the opening portion;
forming a second conductive film including aluminum on the first conductive film and in the opening portion; and
flattening a surface of the second conductive film by performing a heat treatment under reduced pressure or in normal pressure.

18. A method for manufacturing a semiconductor device according to claim 17, wherein from the steps of forming the first and the second conductive film to the steps of performing the beat treatment is sequentially carried out without being exposed to atmosphere.

19. A method for manufacturing a semiconductor device according to claim 17, wherein irradiation of light from ultraviolet to infrared by a lamp is used as the heat treatment.

20. A method for manufacturing a semiconductor device according to claim 17, wherein gas laser irradiation or solid-state laser irradiation which performs pulsed oscillation or continuous oscillation is performed as the heat treatment for the second conductive film.

21. A method for manufacturing a semiconductor device according to claim 17, wherein the organic insulating film includes one kind selected from acryl, polyimide, polyamide, polyimidamide, epoxyacryl, benzocyclobutene, parylene and flare.

22. A method for manufacturing a semiconductor device according to claim 17, wherein the organic insulating film includes a skeleton structure with a bond of silicon (Si) and oxygen (O) and includes at least hydrogen in the substituent, or a film at least including a kind of a fluorine, an alkyl group, and aromatic hydrocarbon in the substituent.

23. A method for manufacturing a semiconductor device according to claim 17, wherein a film including titanium, tantalum, tungsten, or silicon is formed as the first conductive film.

24. A method for manufacturing a semiconductor device according to claim 17, further comprising the steps of:
forming a third conductive film over the second conductive film;
wherein the third conductive film includes one kind or plural kinds of element selected from germanium, tin, gallium, zinc, lead, indium, or scandium.

25. A method for manufacturing a semiconductor device comprising the steps of:
forming an organic insulating film;
forming an opening portion in the organic insulating film;
forming a nitride film on the organic insulating film and in the opening portion;
patterning the nitride film so tat a layer under the organic insulating film is exposed in the opening portion;
forming a first conductive film on the nitride film and the exposed portion of the layer;

forming a second conductive film including aluminum on the first conductive film and in the opening portion; and flattening a surface of the second conductive film by performing a heat treatment under reduced pressure or in normal pressure.

26. A method for manufacturing a semiconductor device according to claim 25, wherein from the steps of forming the first and the second conductive film to the steps of performing the heat treatment is sequentially carried out without being exposed to atmosphere.

27. A method for manufacturing a semiconductor device according to claim 25, wherein irradiation of light from ultraviolet to infrared by a lamp is used as the heat treatment.

28. A method for manufacturing a semiconductor device according to claim 25, wherein gas laser irradiation or solid-state laser irradiation which performs pulsed oscillation or continuous oscillation is performed as the heat treatment for the second conductive film.

29. A method for manufacturing a semiconductor device according to claim 25, wherein the organic insulating film includes one kind selected from acryl, polyimide, polyamide, polyimidamide, epoxyacryl, benzocyclobutene, parylene and flare.

30. A method for manufacturing a semiconductor device according to claim 25, wherein the organic insulating film includes a skeleton structure with a bond of silicon (Si) and oxygen (O) and includes at least hydrogen in the substituent, or a film at least including a kind of a fluorine, an alkyl group, and aromatic hydrocarbon in the substituent.

31. A method for manufacturing a semiconductor device according to claim 25, wherein a film including titanium, tantalum, tungsten, or silicon is formed as the first conductive film.

32. A method for manufacturing a semiconductor device according to claim 25, further comprising the steps of:
    forming a third conductive film over the second conductive film;
    wherein the third conductive film includes one kind or plural kinds of element selected from germanium, tin, gallium, zinc, lead, indium, or scandium.

33. A method for manufacturing a semiconductor device comprising the steps of:
    forming an organic insulating film;
    forming an opening portion in the organic insulating film;
    forming a first conductive film so as to be in contact with the organic insulating film and in the opening portion;
    forming a second conductive film including aluminum so as to be in contact with the first conductive film; and
    flattening a surface of the second conductive film by selectively performing a laser irradiation which performs pulsed oscillation or continuous oscillation under reduced pressure or in normal pressure for the second conductive film.

34. A method for manufacturing a semiconductor device according to claim 33, wherein from the steps of forming the first and the second conductive film to the steps of selectively performing the laser irradiation is sequentially carried out without being exposed to atmosphere.

35. A method for manufacturing a semiconductor device according to claim 33, wherein the organic insulating film includes one kind selected from acryl, polyimide, polyamide, polyimidamide, epoxyacryl, benzocyclobutene, parylene and flare.

36. A method for manufacturing a semiconductor device according to claim 33, wherein the organic insulating film includes a skeleton structure with a bond of silicon (Si) and oxygen (O) and includes at least hydrogen in the substituent, or a film at least including a kind of a fluorine, an alkyl group, and aromatic hydrocarbon in the substituent.

37. A method for manufacturing a semiconductor device according to claim 33, wherein a film including titanium, tantalum, tungsten, or silicon is formed as the first conductive film.

38. A method for manufacturing a semiconductor device according to claim 33, further comprising the steps of:
    forming a third conductive film over the second conductive film;
    wherein the third conductive film includes one kind or plural kinds of element selected from germanium, tin, gallium, zinc, lead, indium, or scandium.

39. A method for manufacturing a semiconductor device comprising the steps of:
    forming an organic insulating film;
    forming an opening portion in the organic insulating film;
    forming a nitride film so as to be in contact with the organic insulating film and in the opening portion;
    patterning the nitride film so that a layer under the organic insulating film is exposed in the opening portion;
    forming a first conductive film so as to be in contact with the nitride film and the exposed portion of the layer;
    forming a second conductive film including aluminum so as to be in contact with the first conductive film; and
    flattening a surface of the second conductive film by selectively performing a laser irradiation which performs pulsed oscillation or continuous oscillation under reduced pressure or in normal pressure for the second conductive film.

40. A method for manufacturing a semiconductor device according to claim 39, wherein from the steps of forming the first and the second conductive film to the steps of selectively performing the laser irradiation is sequentially carried out without being exposed to atmosphere.

41. A method for manufacturing a semiconductor device according to claim 39, wherein the organic insulating film includes one kind selected from acryl, polyimide, polyamide, polyimidamide, epoxyacryl, benzocyclobutene, parylene and flare.

42. A method for manufacturing a semiconductor device according to claim 39, wherein the organic insulating film includes a skeleton structure with a bond of silicon (Si) and oxygen (O) and includes at least hydrogen in the substituent, or a film at least including a kind of a fluorine, an alkyl group, and aromatic hydrocarbon in the substituent.

43. A method for manufacturing a semiconductor device according to claim 39, wherein a film including titanium, tantalum, tungsten, or silicon is formed as the first conductive film.

44. A method for manufacturing a semiconductor device according to claim 39, further comprising the steps of:
    forming a third conductive film over the second conductive film;
    wherein the third conductive film includes one kind or plural kinds of element selected from germanium, tin, gallium, zinc, lead, indium, or scandium.

* * * * *